United States Patent
Kukulka et al.

(10) Patent No.: US 7,335,835 B2
(45) Date of Patent: Feb. 26, 2008

(54) SOLAR CELL STRUCTURE WITH BY-PASS DIODE AND WRAPPED FRONT-SIDE DIODE INTERCONNECTION

(75) Inventors: Jerry R. Kukulka, Santa Clarita, CA (US); David R. Lillington, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 892 days.

(21) Appl. No.: 10/295,060

(22) Filed: Nov. 8, 2002

(65) Prior Publication Data

US 2004/0089339 A1    May 13, 2004

(51) Int. Cl.
   *H01L 31/00* (2006.01)
(52) U.S. Cl. ........................ 136/256; 136/252
(58) Field of Classification Search ......... 136/243–265
   See application file for complete search history.

(56) References Cited

U.S. PATENT DOCUMENTS

| | | | |
|---|---|---|---|
| 4,064,521 A | 12/1977 | Carlson | |
| 4,409,605 A | 10/1983 | Ovshinsky et al. | |
| 4,636,578 A * | 1/1987 | Feinberg | 136/251 |
| 5,330,585 A | 7/1994 | Chang et al. | |
| 5,425,816 A * | 6/1995 | Cavicchi et al. | 438/98 |
| 5,616,185 A * | 4/1997 | Kukulka | 136/244 |
| 6,013,870 A * | 1/2000 | Psyk et al. | 136/249 |
| 6,313,396 B1 * | 11/2001 | Glenn | 136/244 |
| 6,384,313 B2 | 5/2002 | Nakagawa et al. | |
| 6,452,086 B1 * | 9/2002 | Muller | 136/244 |
| 6,531,653 B1 * | 3/2003 | Glenn et al. | 136/246 |

FOREIGN PATENT DOCUMENTS

WO    WO 00/21138    * 4/2000

OTHER PUBLICATIONS

Definition of "layer" from the Online Edition of Webster's 3rd International Dictionary, 2 pages, date not available.*

* cited by examiner

*Primary Examiner*—Nam Nguyen
*Assistant Examiner*—Jeffrey Barton
(74) *Attorney, Agent, or Firm*—McNees Wallace & Nurick LLC

(57) ABSTRACT

A solar cell structure includes a solar cell having a front side and a back side and an active semiconductor structure. The solar cell produces a voltage when the front side is illuminated. The solar cell is protected by a by-pass diode structure including a by-pass diode positioned at the back side of the solar cell. A first electrical interconnection structure extends between the back side of the solar cell and the first diode terminal, and a second electrical interconnection structure extends between the front side of the solar cell and the second diode terminal. An entire length of the second electrical interconnection structure contacts the solar cell.

19 Claims, 3 Drawing Sheets

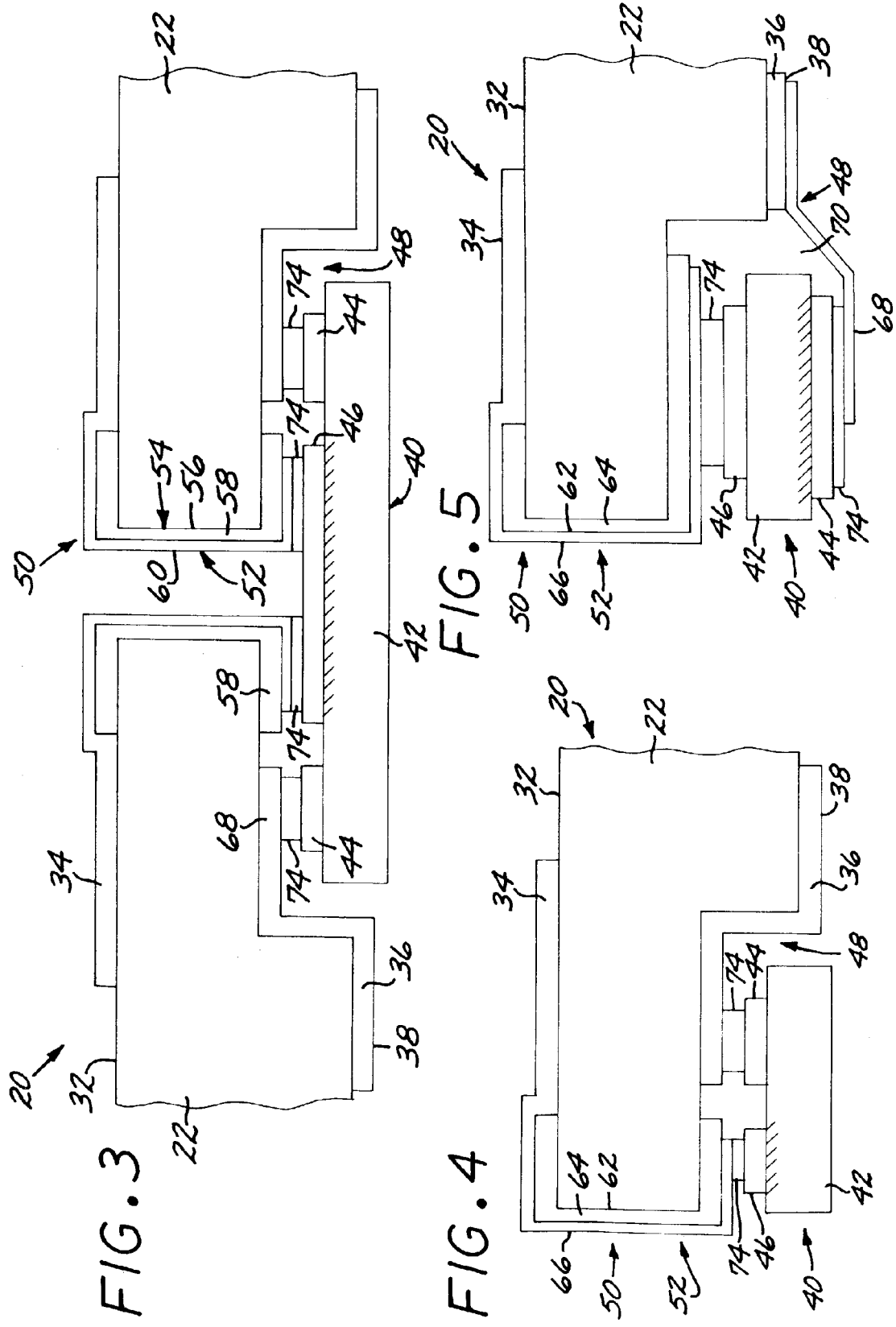

SOLAR CELL STRUCTURE WITH BY-PASS DIODE AND WRAPPED FRONT-SIDE DIODE INTERCONNECTION

This invention relates to a solar cell structure protected by a by-pass diode and, more particularly, to the electrical interconnection extending between the by-pass diode and the front side of the solar cell.

BACKGROUND OF THE INVENTION

A solar cell is formed of two semiconductor layers in facing contact with each other at a semiconductor junction. When illuminated by the sun or otherwise, the solar cell produces a voltage between the semiconductor layers. Advanced solar cells may include more than two semiconductor layers and their respective pairwise semiconductor junctions. The various pairs of semiconductor layers of the advanced solar cells are tuned to the various spectral components of the sun to maximize the power output of the solar cell.

The voltage and current output of the solar cell are limited by the materials of construction and the surface area of the solar cell. Most commonly, a number of solar cells are electrically interconnected in series and/or parallel arrays to form a solar cell structure that produces higher voltages and/or higher currents than are possible with the single solar cell. Such solar cell structures are now used in both space and terrestrial applications.

The solar cell structure works well when all of the solar cells are illuminated with about the same illumination intensity. However, if one of the solar cells of the solar cell structure is shaded while the others remain fully illuminated, the shaded solar cell is subjected to a reverse-bias condition by the continuing voltage and current output of the remaining solar cells.

Fortunately, each solar cell may be protected against the damage arising during the reverse-bias condition by a parallel diode that does not pass current when the solar cell is not reverse biased, but passes the impressed current when the solar cell is reverse biased. The diode thus protects the individual cell against reverse-bias damage.

A number of diode configurations are in use and are operable, but each has its drawbacks. In one configuration, a discrete diode is bonded to the back side of the solar cell and interconnected to the semiconductor layers of the solar cell with leads. This approach requires the bonding of interconnection taps and the leads, a time-consuming process when a large number of solar cells are present in the solar cell structure. In another configuration, the diode is grown onto the front surface of the solar cell as part of the deposition process and then interconnected to the next cell in series. This approach is complex and causes assembly difficulties as well as reduced production yields and reduced solar cell efficiency. In yet another configuration, the diode is also grown into the front surface of the solar cell and interconnected with discrete or lithographic techniques. This approach is also complex, and has reduced production yields and reduced solar cell efficiency.

There is a need for an improved approach to the protection of solar cells against reverse-bias damage. The present invention fulfills this need, and further provides related advantages.

SUMMARY OF THE INVENTION

The present invention provides a solar cell structure including a solar cell protected against reverse-bias damage. The protection utilizes a discrete by-pass diode placed at the back side of the solar cell, so that the by-pass diode does not obscure the front side of the solar cell and reduce its efficiency. The electrical interconnections between the front and back sides of the solar cell and the by-pass diode are not wires that are wire-bonded or otherwise connected, but instead are traces that are deposited upon the solar cell. This approach reduces the cost of the diode-protected solar cell structures, while achieving high reliability in extended service and high solar-cell efficiency.

In accordance with the invention, a solar cell structure comprises a solar cell having a front side and a back side and having an active semiconductor structure. The solar cell produces a voltage when the front side is illuminated. A by-pass diode structure comprises a by-pass diode positioned at the back side of the solar cell. The by-pass diode is preferably supported on the back side of the solar cell. The by-pass diode has a first diode terminal and a second diode terminal. There is a first electrical interconnection structure extending between the back side of the solar cell and the first diode terminal, and a second electrical interconnection structure extending between the front side of the solar cell and the second diode terminal. An entire length of the second electrical interconnection structure extending between the front side of the solar cell and the second diode terminal contacts the solar cell.

In one embodiment, the second electrical interconnection structure comprises a via extending through the solar cell and having a via wall, an insulation layer overlying and contacting at least a portion of the via wall, and a metallic layer overlying and contacting the insulation layer and extending from the front side of the solar cell, along the via wall, and to the second diode terminal. In a second embodiment, the solar cell has a solar cell edge, and the second electrical interconnection structure comprises an insulation layer overlying at least a portion of the solar cell edge, and a metallic layer overlying the insulation layer and extending from the front side of the solar cell, along the solar cell edge, and to the second diode terminal. In a third embodiment, the solar cell has a solar cell edge recess extending from the front side to the back side, and the second electrical interconnection structure comprises an insulation layer overlying at least a portion of the solar cell edge recess, and a metallic layer overlying the insulation layer and extending from the front side of the solar cell, along the solar cell edge recess, and to the second diode terminal.

The solar cell also preferably has a front-side metallization contacting the front side of the solar cell. The second electrical interconnection structure comprises a metallic layer extending between the front-side metallization and the second diode terminal.

In another form, a solar cell structure comprises a solar cell having a front side and a back side. The solar cell comprises a substrate facing the back side of the solar cell, and an active semiconductor structure having a first side contacting the substrate in facing relation thereto and a second side facing the front side of the solar cell. The active semiconductor structure comprises two semiconductor layers in facing contact with each other to form a semiconductor junction producing a voltage between the two semiconductor layers when illuminated. A by-pass diode structure comprises a by-pass diode positioned at the back side of the solar cell, wherein the by-pass diode has a first diode terminal and a second diode terminal, a first electrical interconnection structure between the back side of the solar cell and the first diode terminal, and a second electrical interconnection structure comprising a metallic layer deposited upon the solar cell and extending between the front side of the solar cell and the second diode terminal. Various compatible specific embodiments and features discussed elsewhere herein may be used with this form of the invention.

In yet another form, a solar cell structure comprises a solar cell having a front side, a back side, and an integral pathway extending between the front side and the back side. The solar cell comprises an active semiconductor structure, wherein the solar cell produces a voltage when the front side is illuminated. A by-pass diode structure comprises a by-pass diode positioned at the back side of the solar cell, wherein the by-pass diode has a first diode terminal and a second diode terminal, a first electrical interconnection structure extending between the back side of the solar cell and the first diode terminal, and a second electrical interconnection structure extending between the front side of the solar cell and the second diode terminal and in contact with the integral pathway of the solar cell. Various compatible specific embodiments and features discussed elsewhere herein may be used with this form of the invention.

The integral pathway may be, for example, a via extending between the front side and the back side of the solar cell, an edge of the solar cell extending between the front side and the back side of the solar cell, or an edge recess extending between the front side and the back side of the solar cell. The second electrical interconnection structure preferably comprises an insulation layer overlying and contacting the integral pathway, and a metallic layer overlying and contacting the insulation layer and extending from the front side of the solar cell, along the integral pathway, and to the second diode terminal.

The present approach achieves by-pass protection of solar cell structures under reverse-bias and other conditions. A by-pass diode is used, but the by-pass diode is electrically interconnected with the solar cell by a different approach than is conventional. In each case, the front-side (second) electrical interconnection is "wrapped" around the solar cell, either a through-wrapping using a via or an edge wrapping. The wrapped front-side electrical interconnection of the present approach uses a deposited trace to achieve the electrical interconnection, rather than a bonded wire. The result is lower cost and higher reliability of the by-pass diode structure.

Other features and advantages of the present invention will be apparent from the following more detailed description of the preferred embodiments, taken in conjunction with the accompanying drawings, which illustrate, by way of example, the principles of the invention. The scope of the invention is not, however, limited to these preferred embodiments.

BRIEF DESCRIPTION OF THE DRAWINGS

FIG. 3 is a sectional view of the solar cell structure of FIG. 1, taken along line 3-3 of FIG. 1 and showing a first embodiment of the by-pass structure;

FIG. 4 is a sectional view of the solar cell structure of FIG. 1, taken along line 4-4 of FIG. 1 and showing a second embodiment of the by-pass structure;

FIG. 5 is a sectional view of the solar cell structure of FIG. 1, taken along line 5-5 of FIG. 1 and showing a third embodiment of the by-pass structure.

DETAILED DESCRIPTION OF THE INVENTION

Figure 1:
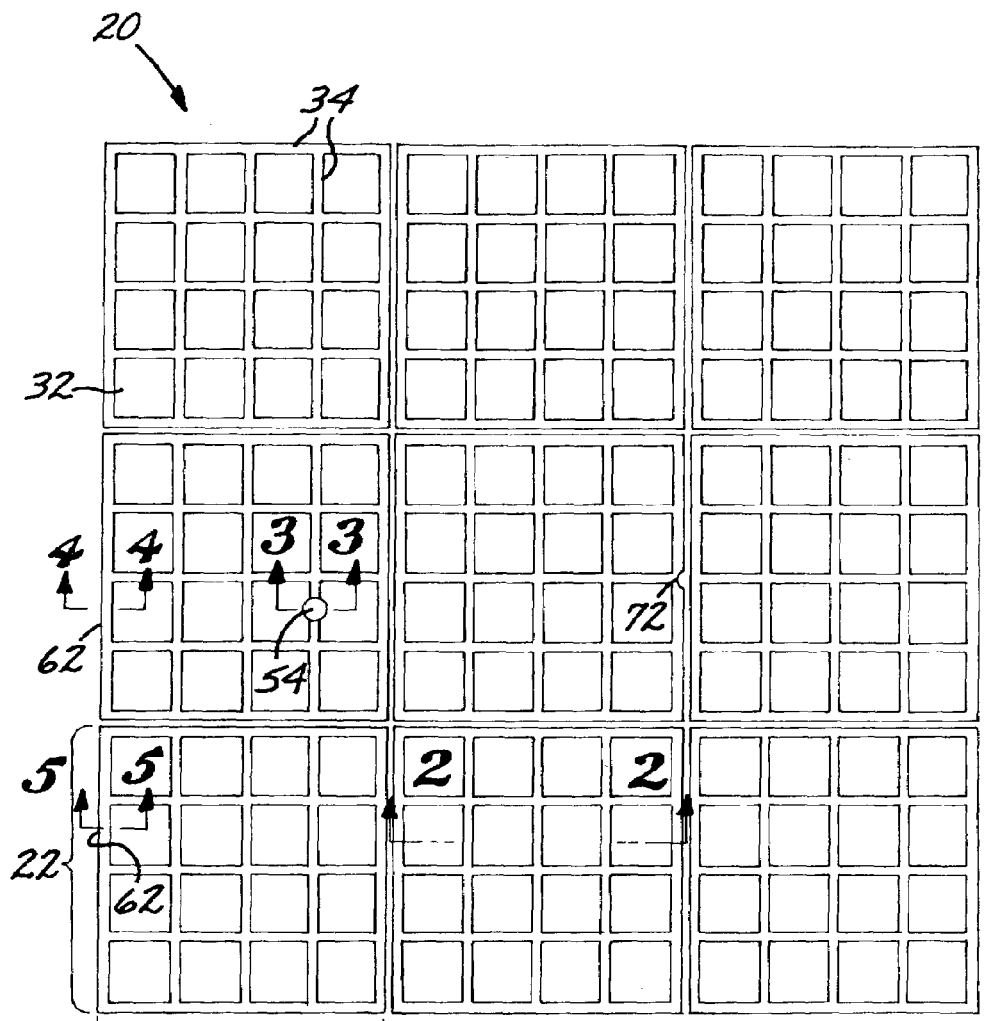
FIG. 1 is a plan view of a solar cell structure.
Figure 2:
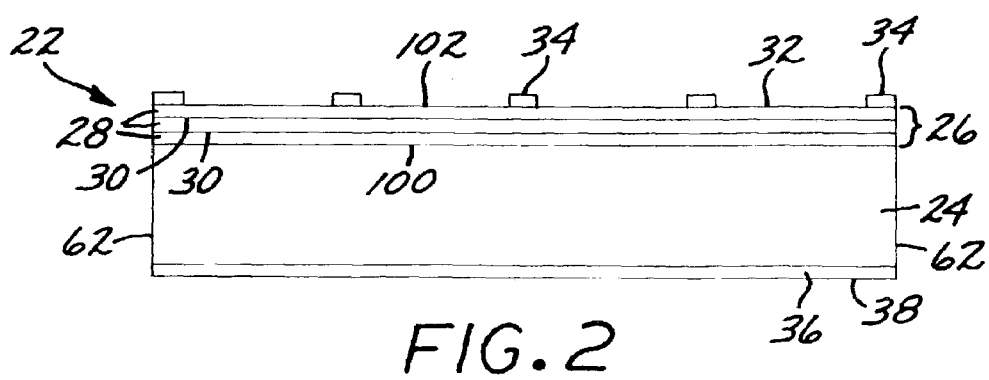
FIG. 2 is a sectional view of the solar cell structure of FIG. 1, taken along line 2-2 of FIG. 1 and not showing any of the by-pass structure.

FIGS. 1-2 depict a solar cell structure 20 made of individual solar cells 22 electrically connected in a series and/or parallel electrical array. In FIG. 1, a plan view from the front (illuminated) side of the solar cell structure 20, nine solar individual solar cells 22 are shown, but typically there are many more in the array.

FIG. 2 illustrates one of the solar cells 22 in sectional view, without any portion of a by-pass diode structure shown. The solar cell 22 includes a substrate 24 and an active semiconductor structure 26 contacting the substrate 24. The active semiconductor structure 26 includes at least two semiconductor layers 28 in facing contact with each other to form at least one semiconductor junction 30 (and in the illustrated case, three semiconductor layers 28 having two semiconductor junctions 30) producing a voltage between the semiconductor layers 28 when illuminated from a front side 32 of the solar cell 22. A first side 100 of the active semiconductor structure 26 faces and typically contacts the substrate 24, and an oppositely disposed second side 102 of the active semiconductor structure faces (and usually constitutes) the front side 32 of the solar cell 22. There is a front side metallization 34 in the form of metallic stripes overlying the front side 32 of the solar cell. An oppositely disposed back-side metallization 36 in the form of a metallic layer overlies an oppositely disposed back side 38 of the solar cell 22. The front-side metallization 34 and the back-side metallization 36 collect a solar-cell electrical current resulting from the voltage produced by the semiconductor junctions 30. The solar cells 22 are usually electrically connected to each other by electrical connections not visible in FIGS. 1-2 in a series and/or parallel array to produced a required voltage and current output of the solar cell array 20.

The solar cell 22 further includes a by-pass diode structure 40, three embodiments of which are illustrated in FIGS. 3-5. In FIGS. 3-5, the solar cell 22 is illustrated generically, without showing details of the substrate and active semiconductor structure. In FIGS. 1-5, common elements of structure are assigned the same reference numerals, and the discussion of the common elements is incorporated into each of the descriptions. Various configurations of solar cells, by-pass diodes, and electrical interconnections are illustrated in FIGS. 1 and 3-5, and the various features may be used interchangeably to the extent that they are compatible. In normal practice, a single type of by-pass diode structure 40 would be used for all of the diodes of the solar cell structure 20 for manufacturing simplicity, but the different embodiments are shown in FIGS. 1 and 3-5 to illustrate some of the possible approaches.

The by-pass diode structure 40 includes a by-pass diode 42 positioned at the back side 38 of the solar cell 22, and preferably supported on and fixed to the back side 38 of the solar cell 22. The by-pass diode 42 has a first diode terminal 44 and a second diode terminal 46. A first electrical interconnection structure 48 extends between the back side 38, and specifically the back-side metallization 36, of the solar cell 22 and the first diode terminal 44. A second electrical interconnection structure 50 extends between the front side 32 of the solar cell 22 and the second diode terminal 46.

In one description of the approach, an entire length of the second electrical interconnection structure 50, extending between the front side 32 of the solar cell 22 and the second diode terminal 46 contacts the solar cell 22. In another description, the second electrical interconnection structure 50 is a metallic layer deposited upon the solar cell 22 and extending between the front side 32 of the solar cell 22 and the second diode terminal 46. In another description, the second electrical interconnection structure 50 constitutes an integral electrically conductive pathway 52 extending between the front side 32 and the back side 38.

FIGS. 3-5 illustrate three embodiments of particular interest. In the via-wrapped embodiment of FIG. 3, the second electrical interconnection structure 50 comprises a via 54 extending through the solar cell 22 and having a via wall 56. An insulation layer 58 overlies and contacts at least a portion of the via wall 56. A metallic layer 60 overlies and contacts the insulation layer 58 and extends from the front side metallization 34 on the front side 32 of the solar cell 22, along the via wall 56, and to the second diode terminal 46. The insulation layer 58 prevents shorting of this metallic layer 60 to the solar cell 22.

In the edge-wrapped embodiment of FIG. 4, the solar cell 22 has a solar cell edge 62. The second electrical interconnection structure 50 includes an insulation layer 64 overlying at least a portion of the solar cell edge 62. A metallic layer 66 overlies the insulation layer 64 and extends from the front side metallization 34 on the front side 32 of the solar cell 22, along the solar cell edge 62, and to the second diode terminal 46. The insulation layer 64 prevents shorting of this metallic layer 66 to the solar cell 22.

The by-pass diodes 42 of the embodiments of FIGS. 3 and 4 have their terminals 44 and 46 on the same face of the by-pass diode 42. The by-pass diode 42 of the embodiment of FIG. 5 has its terminals 44 and 46 on opposite faces of the by-pass diode 42. In the embodiment of FIG. 5, the first electrical interconnection structure 48 is a metallic layer 68 extending across the top of an insulating mesa 70 from the back-side metallization 36 to the first diode terminal 44. The second electrical interconnection structure 50 may be the edge-wrapped structure of FIG. 4 (as illustrated) or the via-wrapped structure of FIG. 3.

In another embodiment, the solar cell 22 has a solar cell edge recess 72 extending from the front side 32 to the back side 38 of the solar cell 22. The solar cell edge recess 72 is a cutout edge, trough, or groove extending down the solar cell edge 62 and constitutes the integral pathway 52. This approach may be implemented with the embodiment of FIG. 4 or with the embodiment of FIG. 5. This approach has the advantage that the metallic layer 66 lies within the solar cell recess 72 and does not project above the profile of the solar cell edge 62. The possibility of an electrical short between the metallic layer 66 and the active semiconductor structure 26 of the adjacent solar cell 22 is thereby reduced. It has the disadvantage that there is a small reduction in the active surface area of the solar cell 22.

In each embodiment, the metallic layers 60, 66, and the back side metallization 36 or the metallic layer 68 (if present) are preferably bonded to achieve a low-impedance electrical contact to the appropriate diode terminal 44 or 46 with a solder or braze layer 74 of a low-melting-point solder or braze material. The solder or braze layers 74 also serve to mechanically bond the bypass diode 42 to the back side 38 of the solar cell 22.

Figure 6:
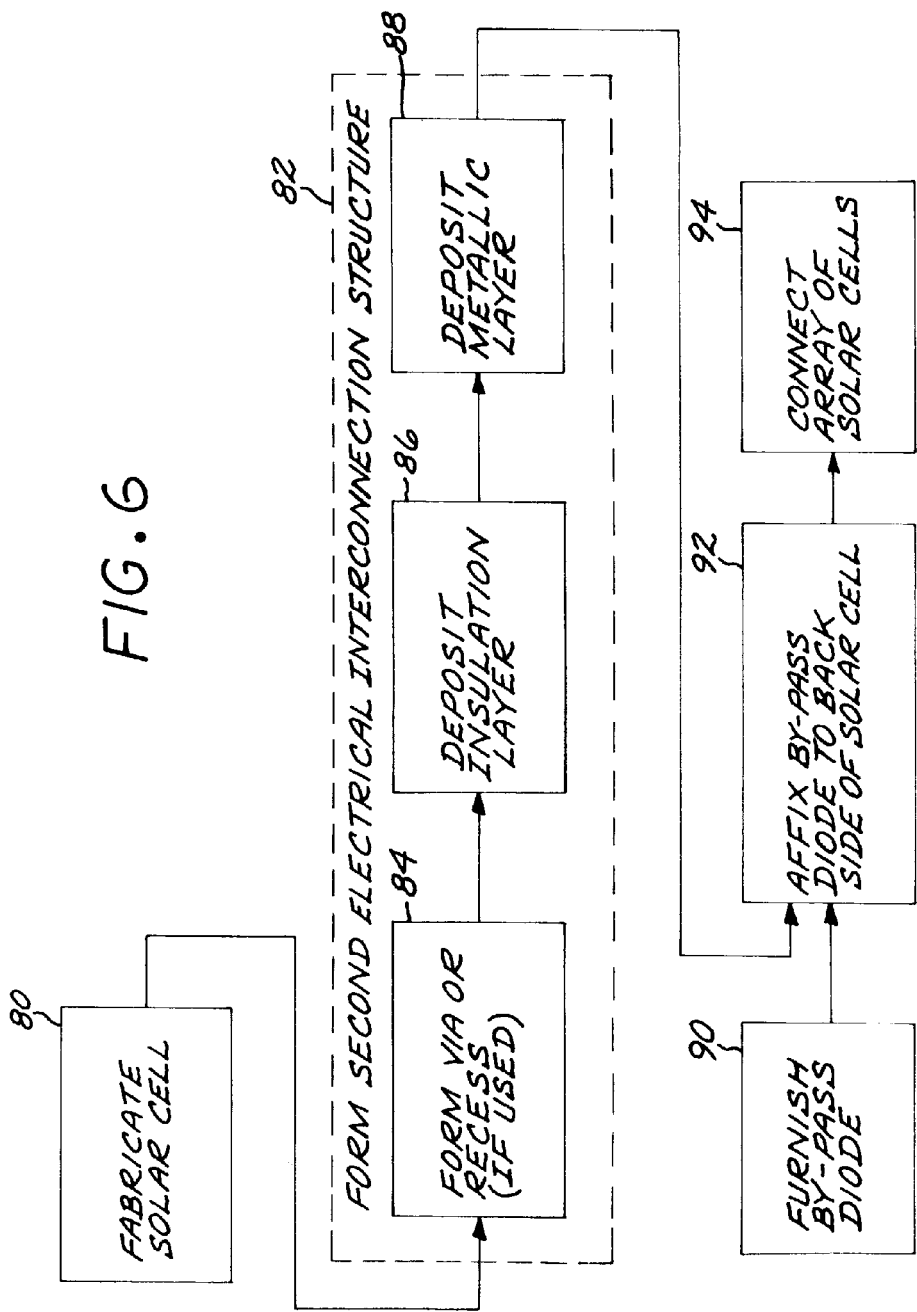
FIG. 6 is a block flow diagram of an approach for preparing a solar cell structure protected by a by-pass diode.

FIG. 6 depicts a preferred approach for fabricating the solar cell structure 20. The basic solar cell, including the substrate 24, the active semiconductor structure 26, the front-side metallization 34, and the back-side metallization 36 is fabricated by conventional techniques, step 80. Such solar cell fabrication techniques, except for the modifications discussed herein, are known in the art, see for example U.S. Pat. No. 5,330,585, whose disclosure is incorporated by reference.

The second electrical interconnection structure 50 is formed, step 82. If the selected structure of the second electrical interconnection structure 50 utilizes a via 54 or a solar cell edge recess 72, the via 54 or solar cell edge recess 72 is formed, step 84. Any operable technique may be used, with mechanical abrasion of the solar cell 22 being preferred. Alternatively but equivalently for the present purposes, the via 54 or solar cell edge recess 72 may be formed during the fabrication step 80. The insulation layer 58 or 64 is deposited in the proper location for the selected structure, step 86. The insulation layer 58 or 64 is made of any operable electrically insulating material such as polyimide, and is deposited by any operable approach such as spraying. The metallic layer 60 or 66 is deposited in the proper location overlying the insulation layer 58 or 64 for the selected structure, step 88. The metallic layer 60 or 66 is made of any operable metallic conductor material such as gold or silver, and is deposited by any operable approach such as vacuum evaporation. Appropriate masking is used in deposition steps to ensure that the deposited material will be deposited only in the desired locations.

A suitable by-pass diode 42 is furnished, step 90. By-pass diodes of the proper characteristics and sizes are available commercially. An example of a presently available by-pass diode 42 is part number 041970 available from Spectrolab, Sylmar, Calif.

The by-pass diode 42 is affixed to the back side 38 of the solar cell 22 by any operable approach, step 92. Most preferably, it is affixed to the metallic layers 60, 66, and the back side metallization 36 or the metallic layer (if present) 68 by soldering or brazing to form the solder or braze layers 74. Any operable solder or braze material and soldering or brazing approach may be used, with use of a conventional lead-tin solder preferred.

The individual solar cells 22 prepared by this approach are electrically connected together in the appropriate series and/or parallel array to produce the desired solar cell structure 20 in the form of a solar cell array, step 94. Any operable connection approach may be used, with welded interconnects preferred.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell structure comprising:
   a solar cell having a front side and a back side and comprising an active semiconductor structure, wherein the solar cell produces a voltage when the front side is illuminated; and
   a by-pass diode structure, wherein the by-pass diode structure comprises
      a by-pass diode positioned at the back side of the solar cell, wherein the by-pass diode has a first diode terminal and a second diode terminal,
      a first electrical interconnection structure extending between the back side of the solar cell and the first diode terminal, and
      a second electrical interconnection structure extending between the front side of the solar cell and the second diode terminal, wherein an entire length of the second electrical interconnection structure extending between the front side of the solar cell and the second diode terminal contacts the solar cell.

2. The solar cell structure of claim 1, wherein the second electrical interconnection structure comprises
   a via extending through the solar cell and having a via wall,
   an insulation layer overlying and contacting at least a portion of the via wall, and
   a metallic layer overlying and contacting the insulation layer and extending from the front side of the solar cell, along the via wall, and to the second diode terminal.

3. The solar cell structure of claim 1, wherein the solar cell has a solar cell edge, and wherein the second electrical interconnection structure comprises
   an insulation layer overlying at least a portion of the solar cell edge, and
   a metallic layer overlying the insulation layer and extending from the front side of the solar cell, along the solar cell edge, and to the second diode terminal.

4. The solar cell structure of claim 1, wherein the solar cell has a solar cell edge recess extending from the front side to the back side, and wherein the second electrical interconnection structure comprises
   an insulation layer overlying at least a portion of the solar cell edge recess, and
   a metallic layer overlying the insulation layer and extending from the front side of the solar cell, along the solar cell edge recess, and to the second diode terminal.

5. The solar cell structure of claim 1, wherein the by-pass diode is supported on the back side of the solar cell.

6. The solar structure of claim 1, wherein the solar cell further comprises
   a front-side metallization contacting the front side of the solar cell, and wherein
   the second electrical interconnection structure comprises
      a metallic layer extending between the front-side metallization and the second diode terminal.

7. A solar cell structure comprising:
   a solar cell having a front side and a back side, wherein the solar cell comprises
      a substrate facing the back side of the solar cell, and
      an active semiconductor structure having a first side contacting the substrate in facing relation thereto and a second side facing the front side of the solar cell, wherein the active semiconductor structure comprises two semiconductor layers in facing contact with each other to form a semiconductor junction producing a voltage between the two semiconductor layers when illuminated; and
   a by-pass diode structure, wherein the by-pass diode structure comprises
      a by-pass diode positioned at the back side of the solar cell, wherein the by-pass diode has a first diode terminal and a second diode terminal,
      a first electrical interconnection structure between the back side of the solar cell and the first diode terminal, and
      a second electrical interconnection structure comprising a metallic layer upon the solar cell and extending between the front side of the solar cell and the second diode terminal.

8. The solar cell structure of claim 7, wherein the second electrical interconnection structure comprises
   a via extending through the solar cell and having a via wall,
   an insulation layer overlying at least a portion of the via wall, and
   the metallic layer overlying the insulation layer and extending from the front side of the solar cell, along the via wall, and to the second diode terminal.

9. The solar cell structure of claim 7, wherein the solar cell has a solar cell edge, and wherein the second electrical interconnection structure comprises
   an insulation layer overlying at least a portion of the solar cell edge, and
   the metallic layer overlying the insulation layer and extending from the front side of the solar cell, along the solar cell edge, and to the second diode terminal.

10. The solar cell structure of claim 7, wherein the solar cell has a solar cell edge recess, and wherein the second electrical interconnection structure comprises
   an insulation layer overlying at least a portion of the solar cell edge recess, and
   the metallic layer overlying the insulation layer and extending from the front side of the solar cell, along the solar cell edge recess, and to the second diode terminal.

11. The solar cell structure of claim 7, wherein the by-pass diode is supported on the back side of the solar cell.

12. The solar structure of claim 7, wherein the solar cell further comprises
   a front-side metallization contacting the front side of the solar cell, and
   wherein
   the second electrical interconnection structure comprises
      the metallic layer extending between the front-side metallization and the second diode terminal.

13. A solar cell structure comprising:
   a solar cell having a front side, a back side, and an integral pathway extending between the front side and the back aide, and wherein the solar cell comprises an active semiconductor structure, wherein the solar cell produces a voltage when the front side is illuminated: and
   a by-pass diode structure, wherein the by-pass diode structure comprises
      a by-pass diode positioned at the back side of the solar cell, wherein the by-pass diode has a first diode terminal and a second diode terminal,
      a first electrical interconnection structure extending between the back side of the solar cell and the first diode terminal, and
      a second electrical interconnection structure extending between the front side of the solar cell and the second diode terminal and in contact with the integral pathway of the solar cell along a length of the second electrical interconnection structure extending between the front side of the solar cell and the second diode terminal.

14. The solar cell structure of claim 13, wherein the integral pathway comprises a via extending between the front side and the back side of the solar cell.

15. The solar cell structure of claim 13, wherein the integral pathway comprises an edge of the solar cell extending between the front side and the back side of the solar cell.

16. The solar cell structure of claim 13, wherein the integral pathway comprises an edge recess extending between the front side and the back side of the solar cell.

17. The solar cell structure of claim 13, wherein the second electrical interconnection structure comprises
   an insulation layer overlying and contacting the integral pathway, and
   a metallic layer overlying and contacting the insulation layer and extending from the front side of the solar cell, along the integral pathway, and to the second diode terminal.

18. The solar cell structure of claim 13, wherein the by-pass diode is supported on the back side of the solar cell.

19. The solar structure of claim 13, wherein the solar cell further comprises
 a front-side metallization contacting the front side of the solar cell, and wherein
 the second electrical interconnection structure comprises a metallic layer extending between the front-side metallization and the second diode terminal.

* * * * *